(12) United States Patent
Stranczl et al.

(10) Patent No.: US 9,317,015 B2
(45) Date of Patent: Apr. 19, 2016

(54) TIMEPIECE ANTI-TRIP MECHANISM

(71) Applicant: Nivarox-FAR S.A., Le Locle (CH)

(72) Inventors: Marc Stranczl, Nyon (CH); Thierry Hessler, St-Aubin (CH)

(73) Assignee: Nivarox-FAR S.A., Le Locle (CH)

( * ) Notice: Subject to any disclaimer, the term of this patent is extended or adjusted under 35 U.S.C. 154(b) by 137 days.

(21) Appl. No.: 14/071,961

(22) Filed: Nov. 5, 2013

(65) Prior Publication Data

US 2014/0133281 A1   May 15, 2014

(30) Foreign Application Priority Data

Nov. 9, 2012   (EP) .................................... 12192026

(51) Int. Cl.
| | |
|---|---|
| *G04B 15/12* | (2006.01) |
| *G04B 15/14* | (2006.01) |
| *G04B 17/26* | (2006.01) |
| *C30B 1/10* | (2006.01) |
| *C30B 29/18* | (2006.01) |

(52) U.S. Cl.
CPC . *G04B 15/14* (2013.01); *C30B 1/10* (2013.01); *C30B 29/18* (2013.01); *G04B 15/12* (2013.01); *G04B 17/26* (2013.01)

(58) Field of Classification Search
CPC ........ G04B 15/06; G04B 15/08; G04B 15/12; G04B 15/14
See application file for complete search history.

(56) References Cited

U.S. PATENT DOCUMENTS

| | | |
|---|---|---|
| 3,956,941 A | 5/1976 | Faivre |
| 2008/0279052 A1 | 11/2008 | Rochat et al. |
| 2010/0214880 A1 | 8/2010 | Rappo et al. |
| 2012/0008468 A1 | 1/2012 | Bossart et al. |
| 2012/0113763 A1 | 5/2012 | Queval |
| 2012/0113765 A1 | 5/2012 | Queval |
| 2013/0070570 A1 | 3/2013 | Colpo et al. |

FOREIGN PATENT DOCUMENTS

| | | |
|---|---|---|
| CH | 703 333 A2 | 12/2011 |
| EP | 1 666 990 A2 | 6/2006 |
| EP | 1 710 636 A1 | 10/2006 |

(Continued)

OTHER PUBLICATIONS

European Search Report issued on Oct. 14, 2013 in European Application 12192026, filed on Nov. 9, 2012 (with English Translation).

(Continued)

*Primary Examiner* — Amy Cohen Johnson
*Assistant Examiner* — Jason Collins
(74) *Attorney, Agent, or Firm* — Oblon, McClelland, Maier & Neustadt, L.L.P.

(57) ABSTRACT

Anti-trip mechanism for limiting the travel of a timepiece balance including a pin projecting from a staff, including a flexible multistable or bistable element carrying an anti-trip stop member and which is fixed, via flexible and elastic connecting members, to a rigid structural element of a timepiece movement. One end of said anti-trip stop member is arranged, according to the angular position of the balance, to interfere with the trajectory of the pin, and to perform the function of a stop if the balance exceeds its normal angular travel.

Each anti-trip stop member includes two arms whose respective ends each interfere with the trajectory of the pin.

15 Claims, 5 Drawing Sheets

(56) References Cited

FOREIGN PATENT DOCUMENTS

| | | |
|---|---|---|
| EP | 1 801 668 A1 | 6/2007 |
| EP | 2 037 335 A2 | 3/2009 |
| EP | 2 407 831 A1 | 1/2012 |
| EP | 2 431 823 A1 | 3/2012 |
| EP | 2 450 756 A1 | 5/2012 |
| EP | 2 450 757 A1 | 5/2012 |
| FR | 2 258 656 | 8/1975 |
| WO | WO 2007/000271 A1 | 1/2007 |
| WO | WO 2011/120180 A1 | 10/2011 |
| WO | WO 2013/144236 A1 | 10/2013 |

OTHER PUBLICATIONS

G. A. Berner, "Illustrated Professional Dictionary of Horology", pp. 250-253, 42-43, 168-169, 700-701, 696-699, 316-319, 220-221, 406-407.

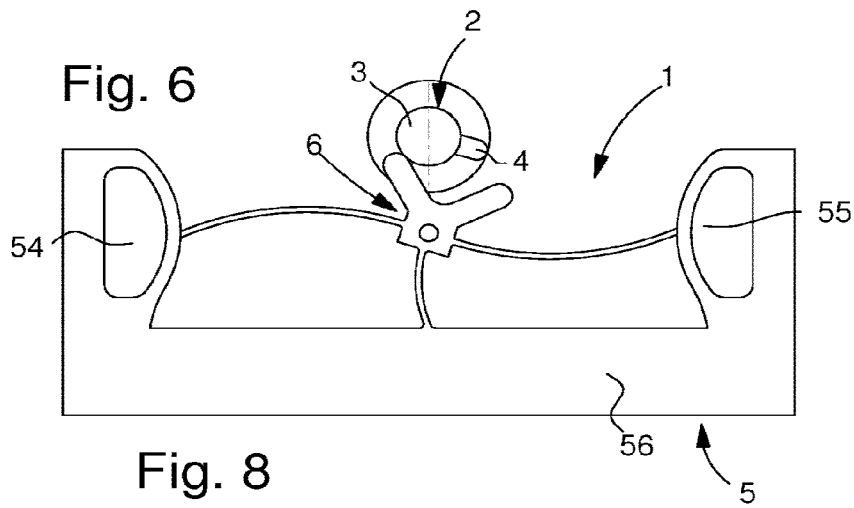
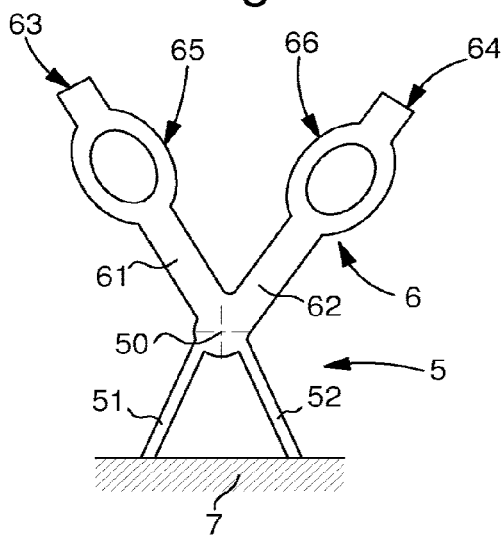
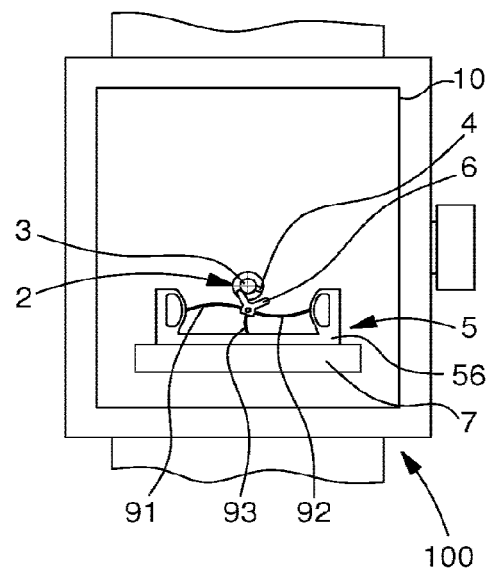
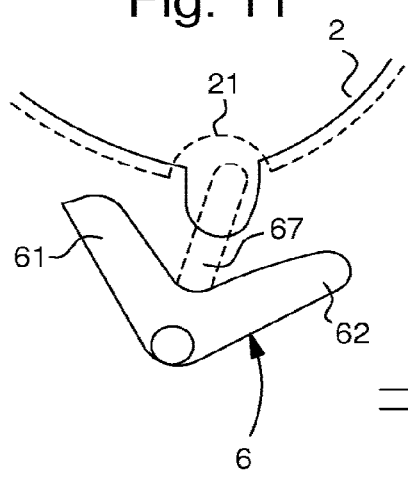
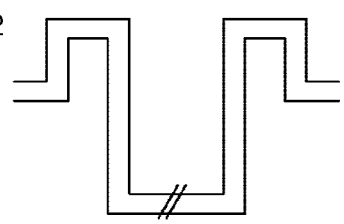
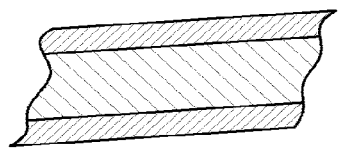

TIMEPIECE ANTI-TRIP MECHANISM

This application claims priority from European Patent application No. 12192026.8 filed Nov. 9, 2012, the entire disclosure of which is incorporated herein by reference.

FIELD OF THE INVENTION

The invention concerns a timepiece limiter or transmission mechanism for limiting or transmitting the angular travel of a mobile component of a timepiece movement, said mobile component including at least one projecting pin or tooth, said timepiece limiter or transmission mechanism including a limiting or transmission means which is fixed, via at least one flexible multistable or bistable element, to another component of said movement or to a rigid structural element of said movement, said mechanism forming an anti-trip mechanism for limiting the angular travel of a timepiece balance of a timepiece movement; said balance includes a staff and a pin projecting from said staff, said anti-trip mechanism including at least one flexible multistable or bistable element, carrying at least one anti-trip stop member, and which is fixed, via flexible and elastic connecting members, to a rigid structural element of said timepiece movement, and wherein one end of said anti-trip stop member is arranged, according to the angular position of said balance, to interfere with the trajectory of said pin, and to perform the function of a stop member if said balance exceeds its normal angular travel.

The invention also concerns a timepiece movement including at least one regulating member having a balance and which includes at least one anti-trip mechanism of this type.

The invention also concerns a timepiece or watch including at least one movement of this type, or at least one anti-trip mechanism of this type.

The invention concerns the field of timepiece escapement mechanisms.

BACKGROUND OF THE INVENTION

Improving rate and the search for improved efficiency are constant preoccupations of mechanical watch designers, who seek to obtain the greatest possible power reserve, combined with regularity, precision and security in the most difficult conditions of use. The regulating assembly and the escape mechanism are at the heart of this problem.

In particular, in mechanical watches, escapements have to satisfy several safety criteria. One of the safety devices, the anti-trip mechanism, is designed to prevent the angular extension of the balance going beyond a normal angle of rotation.

EP Patent No 1801668 B1 in the name of Montres Breguet SA proposes a mechanism whose structure is characterized in that it includes a pinion mounted on the balance staff. This pinion meshes with a toothed wheel, at least one radius of which abuts against a fixed stop if the balance is driven beyond its normal angle of rotation. However, this mechanism affects the inertia of the balance and may disturb its oscillations. Further, there is friction in the gear forming the mechanism which also disturbs the regulating mechanism.

EP Patent Application No 1 666990 A2 in the name of Montres Breguet SA discloses another anti-trip mechanism based on the expansion of the balance spring: a locking arm, fixed to the outer coil of the balance spring, is inserted between a finger integral with the balance and two columns integral with the balance bar. Locking only occurs in the event of excessive expansion of the balance spring beyond an angle exceeding its normal operating angle. This mechanism only limits the angle of rotation in one direction of rotation.

In short, known safety mechanisms each have at least one of the recurrent drawbacks: disruption of the oscillations by modifying the inertia of the regulating member, adversely affecting efficiency under the effect of friction, or limiting the angle of rotation in only one direction of rotation.

EP Patent Application No 2450756 A1 in the name of Nivarox discloses an anti-trip device for an escapement mechanism, with a pivoting mobile component carrying a finger which moves in a cam path integral with the balance. This pivoting mobile component may include an arm with a bistable lever, particularly an elastic bistable lever.

EP Patent Application No 2037335 A2 in the name of Enzler-Von-Gunten discloses a pallet lever which has two arms provided with pallet stones, and a pallet fork, the assembly being formed in a single piece with two flexible securing arms, which define a virtual pivot axis of the pallet lever, and allow the pallet lever to pivot when they bend, the median axes of these two strips intersecting on the virtual axis.

The international application No WO2011/120 180 A1 in the name of ROLEX describes a blocking device for an escapement wheel. This device includes a blocker with two pallets bound with a structure via two elastic blades in order to define a virtual pivot. A third elastic blade acts laterally on this blocker.

The Swiss Patent Application No CH 703 333 A2 in the name of FRAGNIERE discloses an anchor with a bistable return spring fixed on the lever of the anchor between the fork and the pivot axis.

EP Patent Application No 1 710 636 A1 in the name of ROCHAT describes a mechanism similar to a detent escapement, with a draw system including a bistable spring.

EP Patent Application No 2 450 757 A1 in the name of NIVAROX describes an antitripping mechanism for an escapement mechanism with a bistable component including amplitude limitation means active against shocks.

The international application No WO 2013/144236 in the name of NIVAROX describes a flexible escapement mechanism with a mobile frame carried by bistable flexible blades.

SUMMARY OF THE INVENTION

It is an object of the present invention to improve the efficiency of a watch and to overcome the aforementioned problems, while only very slightly disrupting the balance oscillations, with negligible or zero loss of efficiency, and while limiting the angular travel of the balance in both directions of rotation.

The anti-trip mechanism according to the invention is based on the principle of storing the position of the balance similar to that of the Swiss lever: an element changes position when the balance passes and positions an anti-trip stop member, in the same manner, in the case of a Swiss lever, as the in and out banking pins or detent pins via the fork and the horns thereof.

The invention therefore concerns a timepiece limiter or transmission mechanism for limiting or transmitting the angular travel of a mobile component of a timepiece movement, said mobile component including at least one pin or projecting tooth, characterized in that said timepiece limiter or transmission mechanism includes limiting or transmission means which are fixed, via at least one flexible multistable or bistable element, to another component of said movement or to a rigid structural element of said movement.

In a particular application, this mechanism is an anti-trip mechanism, for limiting the angular travel of a timepiece balance of a timepiece movement, said balance includes a staff and a pin projecting from said staff. The anti-trip mechanism according to the invention is based on the principle of storing the position of the balance in a similar way to the Swiss lever: an element changes position when the balance passes and positions an anti-trip stop member, in the same way, in a Swiss lever, as the exit and entry banking pins or detent pins via the fork and the horns thereof. According to the invention, this anti-trip mechanism includes at least one flexible multistable or bistable element, which carries at least one anti-trip stop member, and which is fixed, via flexible and elastic connecting elements, to a rigid structural element of said timepiece movement.

The invention therefore concerns a timepiece limiter or transmission mechanism for limiting or transmitting the angular travel of a mobile component of a timepiece movement, said mobile component including at least one projecting pin or tooth, said timepiece limiter or transmission mechanism including a limiting or transmission means which is fixed, via at least one flexible multistable or bistable element, to another component of said movement or to a rigid structural element of said movement, said mechanism forming an anti-trip mechanism for limiting the angular travel of a timepiece balance of a timepiece movement; said balance includes a staff and a pin projecting from said staff, said anti-trip mechanism including at least one flexible multistable or bistable element, carrying at least one anti-trip stop member, and which is fixed, via flexible and elastic connecting members, to a rigid structural element of said timepiece movement, and wherein one end of said anti-trip stop member is arranged, according to the angular position of said balance, to interfere with the trajectory of said pin, and to perform the function of a stop member if said balance exceeds its normal angular travel, characterized in that said anti-trip stop member has two arms, whose respective ends can each interfere with the trajectory of said pin.

The invention further concerns a timepiece movement which includes at least one regulating member with a balance, and which has at least one anti-trip mechanism of this type, and is characterized in that said movement includes a structure to which a said flexible multistable or bistable element of said anti-trip mechanism is fixed, or which is formed by said flexible multistable or bistable element.

The invention also concerns a timepiece or watch including at least one movement of this type, or at least one anti-trip mechanism of this type.

BRIEF DESCRIPTION OF THE DRAWINGS

Other features and advantages of the invention will appear upon reading the following detailed description, with reference to the annexed drawings, in which:

FIG. 6 illustrates a variant of FIG. 5 wherein the prestress is achieved by pockets of silicon oxide in a silicon frame.

FIG. 8 illustrates a variant with anti-trip stop arms including flexible shock absorbing areas;

FIG. 9 shows a partial schematic view of a timepiece in the form of a watch including a movement with an anti-trip device according to the invention;

FIG. 11 illustrates a detail of an anti-trip mechanism including at least two levels for holding the arms of the anti-strip system in the plane of the balance pin: a first, top level with arms cooperating with said pin, and a second, lower level with a dart cooperating with a notch.

FIG. 12 is a structure that can be deformed by oxidising silicon, in a variant of the FIG. 7A structure.

FIG. 13 shows the cross-section of a single crystal quartz structure, for making an anti-trip mechanism according to the invention.

DETAILED DESCRIPTION OF PREFERRED EMBODIMENTS

Figure 1:
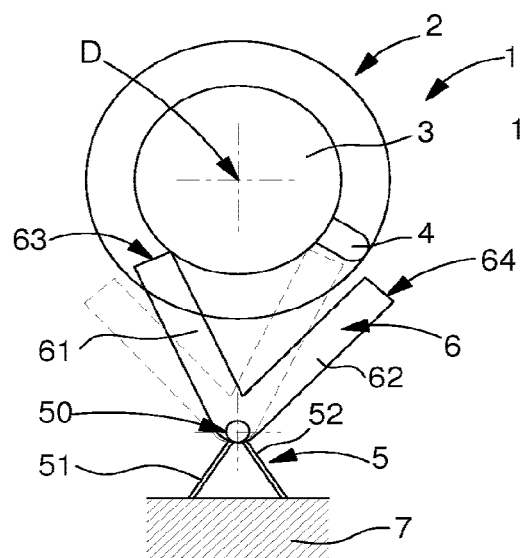
FIG. 1 shows a schematic front view of a timepiece limiter or transmission mechanism according to the invention, made in the form of an anti-trip mechanism according to the invention, fixed to a structure of a movement and cooperating alternately via one of several arms comprised therein, two in this illustration, with a pin of a balance.

The invention concerns a timepiece limiter or transmission mechanism 1000 for limiting or transmitting the angular travel of a mobile component 2000 of a timepiece movement 10, said mobile component 2000 including at least one projecting pin or tooth 4000, particularly a radially projecting tooth 5001 or axially projecting pin 4. According to the invention, this timepiece limiter or transmission mechanism 1000 includes limiting or transmission means 6000 which are fixed, via at least one multi-stable flexible element, in particular a multistable or bistable element 5, to another component of movement 10 or to a rigid structural element 7 of movement 10.

In a particular application, this timepiece limiter or transmission mechanism 1000 is an anti-trip mechanism 1, which is intended to prevent a timepiece balance 2 racing. The balance includes a staff 3 and a pin 4 or a similar element projecting from said staff 3.

This anti-trip mechanism 1 includes at least one monolithic, flexible, multistable or bistable element, which will be designated hereinafter "flexible multistable or bistable element 5" carrying at least one anti-trip stop member 6 and which is fixed, via flexible and elastic connecting elements, to a rigid structural element 7, such as a bottom plate, bar or similar of a timepiece movement 10 in which there is integrated a regulating member to which balance 2 pertains.

In a particular variant, this structure 7 contains a system of self-alignment with the staff of balance 2.

This flexible multistable or bistable element 5 carries at least one anti-trip stop member 6, one end 63 or 64 of which may, according to the angular position of balance 2, interfere with the trajectory of pin 4, and perform the function of a stop member if balance 2 exceeds its normal angular travel.

FIG. 1 sets out a flow diagram, in a particular, preferred but non-limiting application, wherein flexible multistable or bistable element 5 and the at least one anti-trip stop member 6 together form a monolithic component. In this advantageous embodiment of the invention, anti-trip stop member 6 includes two arms 61, 62, whose respective ends 63, 64 may each, according to the position of balance 2, interfere with the trajectory of pin 4, and perform the function of a stop member if balance 2 exceeds its normal angular travel. This embodiment with two arms, as illustrated, limits the angle of rotation of balance 2 in both directions of rotation of said balance. FIG. 1 shows, in dotted lines, a position of interference with balance 2, limiting the angular travel thereof.

Figure 10:
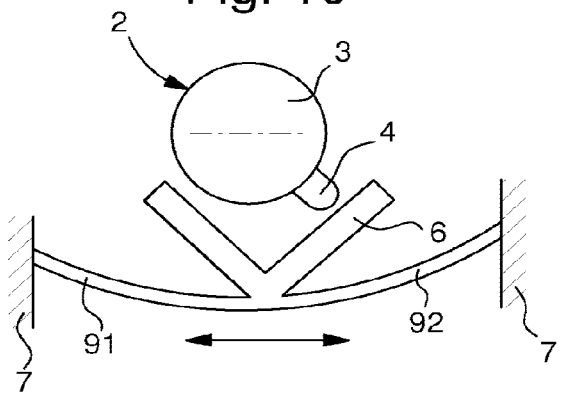
FIG. 10 illustrates a configuration in which a virtual multistable or bistable pivot of the anti-trip mechanism is movable in translation.
Figure 16:
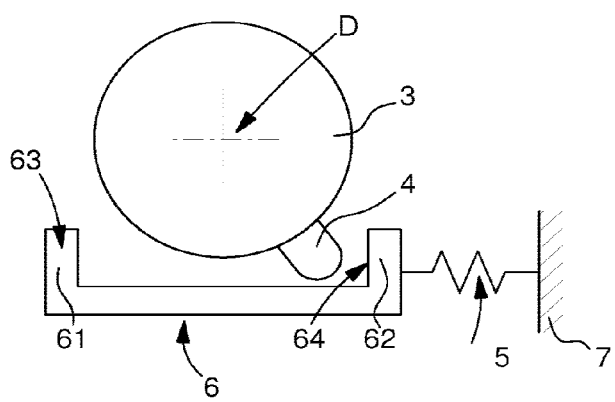
FIG. 16 is a schematic view, similar to FIG. 10, of a more general case where the movement may be any movement, and is bistable.

Flexible multistable or bistable element 5 is illustrated here with these flexible and elastic connecting elements which are formed by at least two thin strips 51, 52, each fixed at a first end to structure 7 and connected via a second end to the body of the flexible element. In the particular case of FIG. 1, the two thin strips 51, 52 are connected via the second ends thereof to the body of the flexible element in a "V" shape, so as to define a virtual pivot 50 about which anti-trip stop member 6 can pivot. Thus, in the case of FIGS. 1 and 2, flexible multistable or bistable element 5 according to the invention is a flexible multistable or bistable pivot. This embodiment is not exclusive; FIG. 10 is a diagram of the case where anti-trip stop member 6 is movable in translation. FIG. 16 illustrates a more general case where the movement may be of any type and is multistable or bistable.

Preferably, at least two flexible arms 51, 91, 52, 92 are mounted prestressed and buckled relative to structure 7 or relative to a frame 56 comprised in flexible multistable or bistable element 5.

Figure 3:
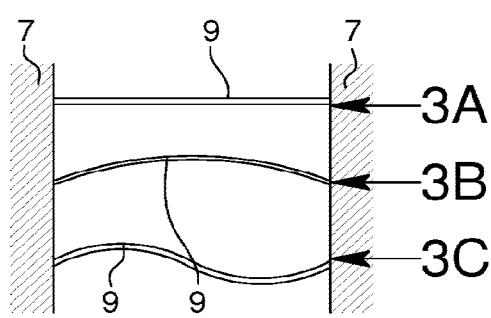
FIG. 3 shows a schematic view of three states of an constrained beam: at rest in 3A, in a first buckling mode in 3B, and in a second buckling mode in 3C.

Each of strips 51, 52 may occupy several states, according to the stresses or forces to which they are subjected. Each of these strips is calculated to work by buckling, and may adopt several geometries, according to the buckling mode, as seen in FIG. 3: at rest in 3A, in a first buckling mode, with a concave or convex shape in 3B, in a second buckling mode with an S or Z shape in 3C, Flexible multistable or bistable element 5 may include flexible elements whose shapes are different to the flexible strips 51, 52, illustrated here, without departing from the invention.

Flexible multistable or bistable element 5 may also, in a particular embodiment, be made in a single piece with structural element 7.

In a particular embodiment, illustrated in FIG. 8, flexible elements 65, 66 may be included in arms 61, 62 of stop member 6 of anti-trip mechanism 1 to prevent excessive shocks.

This flexible multistable or bistable element 5 may be made in silicon technology, "LIGA", MEMS or similar. It has very low inertia compared to that of balance 2, and the actuation thereof only slightly disrupts the oscillations of balance 2.

Figure 2:
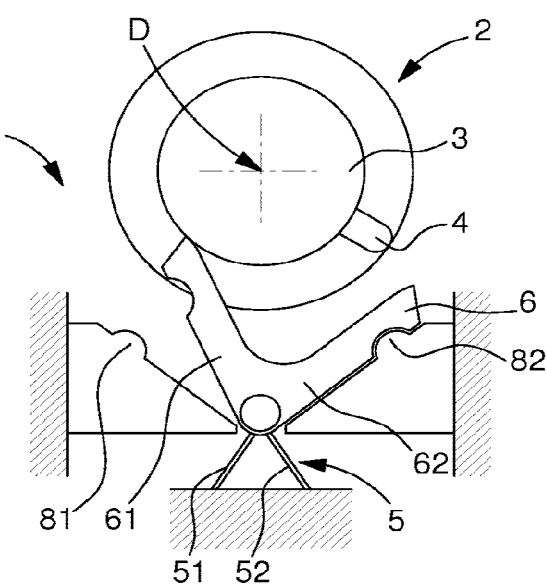
FIG. 2 shows a similar view to FIG. 1 of the same mechanism supplemented by a shock absorber mechanism.
Figure 5:
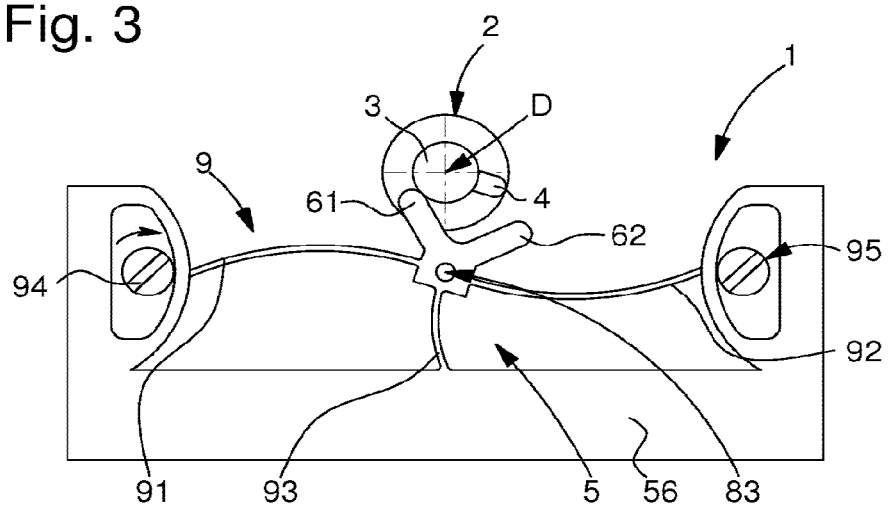
FIG. 5 shows a schematic front view of an embodiment of the invention according to the principle of FIG. 4, with the beam buckled and prestressed by off-centre screws, and in a single piece embodiment.

FIG. 2 illustrates a shock absorber mechanism for protecting flexible strips 51 and 52 of flexible multistable or bistable element 5. This mechanism is useful, or even necessary, in cases where anti-trip stop members 6 have to limit the amplitude of balance 2. The purpose thereof is to absorb shocks in shock absorber stop members 81, 82, which cooperate in abutment with arms 61, 62 and not to transmit these shocks to flexible arms 51, 52 to avoid breaking said arms. FIG. 5 shows a shock absorber stop member 83 coaxial with the flexible pivot. In this example embodiment, the shock absorber stop members 81 and 82 include substantially cylindrical protuberances, which cooperate with grooves of substantially complementary shape in arms 61 and 62.

Flexible multistable or bistable pivot 5 may be made in accordance with several principles. FIG. 3 introduces the principle of a multistable or bistable state considered in this particular case. Use is made of the natural buckling modes of a beam 9 subjected to a stress, more particularly the second mode illustrated in FIG. 3C.

Figure 4:
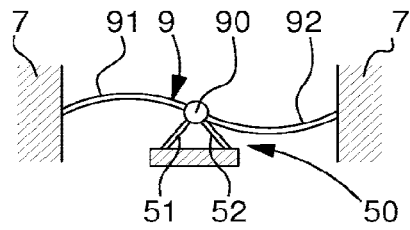
FIG. 4 shows a schematic front view of an constrained, prestressed beam, buckled in the second mode of FIG. 3A under the action of a flexible pivot.

As shown in FIG. 4, in an advantageous embodiment, in order to force beam 9 to buckle in the second mode, a pivot 90 forces beam 9 to have a nodal point at the middle thereof (centre of rotation of the added pivot). The centre of rotation 50 of multistable or bistable pivot 5 is then the centre of rotation of the added pivot 90.

FIG. 5 shows a complete anti-trip mechanism 1 made in accordance with this principle. Flexible multistable or bistable pivot 5 includes at least one prestressed beam 9 buckled in the second mode where beam 9 adopts an S or Z shape, a pivot 90 forcing said beam 9 to have a nodal point in the median area, preferably in the middle thereof. Preferably in the case of FIG. 5, flexible multistable or bistable pivot 5 is made by buckling two prestressed beams 91 and 92 (which together form beam 9) by stressing them here using two off-centre screws 94 and 95. A third beam 93 fixed to structure 7 or to a frame 56 of flexible multistable or bistable element 5, forces beam 9, formed of beams 91 and 92, to deform in the second mode, and plays the part of pivot 90 of FIG. 4. Shock absorber stop member 83 is located in the centre of rotation 50 of flexible multistable or bistable pivot 5.

FIG. 11 illustrates an anti-trip stop member 6 including at least two levels for holding arms 61, 62 of the anti-trip system in the plane of balance pin 4: a first top level with arms 61 and 62 cooperating with pin 4 and a second lower level with a dart 67 cooperating with a notch 21 of balance 2.

To remove any contacts or decrease any contact pressure, anti-trip mechanism 1 according to the invention may also advantageously include means for creating a repulsion force or torque between balance 2 and arms 61, 62 of anti-trip mechanism 1.

Figure 14:
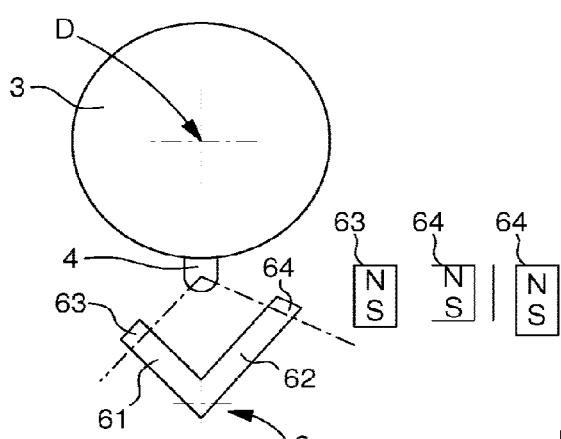
FIG. 14 illustrates a mechanism according to the invention, with a repulsion function, between the balance pin and the arms of the anti-trip mechanism, performed by magnets located in a vertical orientation, and in a cross-section along the dotted line.
Figure 15:
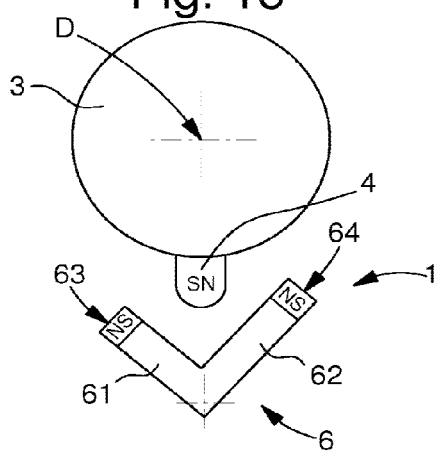
FIG. 15 illustrates a similar embodiment, oriented in the plane of the magnetic field.

FIG. 14 illustrates the case where this repulsion function is performed by magnets located in a vertical orientation, on pin 4 and ends 63, 64 of arms 61, 62. FIG. 15 illustrates a similar embodiment, with orientation in the plane of the magnetic field; the north and south poles of these magnets are shown.

In a similar location, in place of magnets, or in addition thereto, electrets may be used (electrostatic charges) to exert these repulsion forces.

This is to increase the efficiency of anti-trip mechanism 1 and to disturb as little a possible the operation of balance 2. The operation of anti-trip mechanism 1 is as follows:

when tipping, in a first phase, balance 2 delivers energy to flexible multistable or bistable element 5;

once past the point of equilibrium, in a second phase, the mechanism returns part of the energy to balance 2 making a small impulse.

The mechanism operates in a similar manner to the horns of a Swiss lever; there is a release and then an impulse.

In a particular embodiment, balance 2 and/or at least arms 61, 62 of anti-trip stop member 6, or the entire anti-trip mechanism 1 when it is in a single piece, in an advantageous embodiment, is made in silicon technology from a silicon wafer, with or without silicon oxide growth, and with a surface layer confining, according to the case, either magnets or magnetic particles on the one hand, or electrets on the other hand. This particular layer may be achieved by a galvanic method, or by cathodic sputtering, or by another suitable micro-technical structuring method.

In the preferred case where flexible multistable or bistable element 5 is produced in silicon technology, the creation of stresses in the strips forming beams 91 and 92 may occur via silicon oxidisation. Indeed, silicon oxide takes up a larger volume when it is grown from silicon, as seen in FIG. 6, where pockets 54, 55 of SiO2 are created in a silicon frame 56. The example of FIG. 5 or 6 shows that this frame 56 may also form structure 7, or be connected thereto in a very simple manner by any ordinary mechanical securing technology.

Figure 6A:
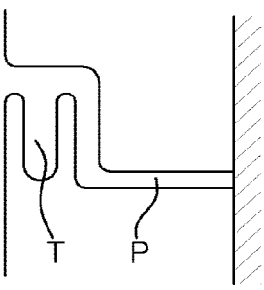
FIGS. 6A and 6B illustrate, before and after the silicon is oxidised, a detail of an area with large differences in cross-section, and greatly modified after the silicon dioxide is formed, and subjecting a straight beam of smaller cross-section to a buckling stress or force.
Figure 6B:
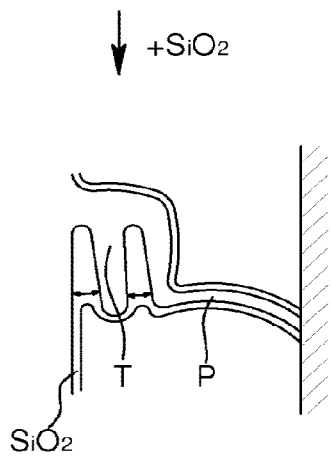

FIGS. 6A and 6B illustrate, before and after silicon oxidisation, a detail of an area having large differences in cross-section, which is greatly modified after silicon dioxide has formed, subjecting to a buckling stress a straight beam P of smaller cross-section than a head T of which the beam forms an extension.

Figure 7A:
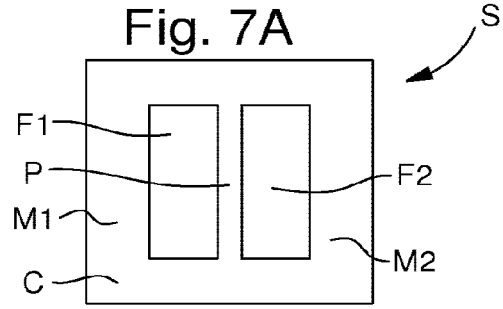
FIGS. 7A, 7B, 7C illustrate successive steps in a method for oxidising and buckling a beam.
Figure 7B:
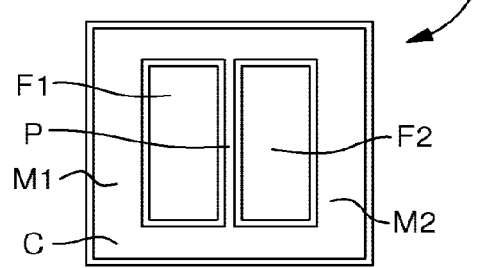
Figure 7C:
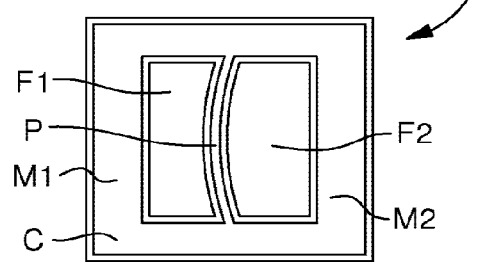
Figure 7:
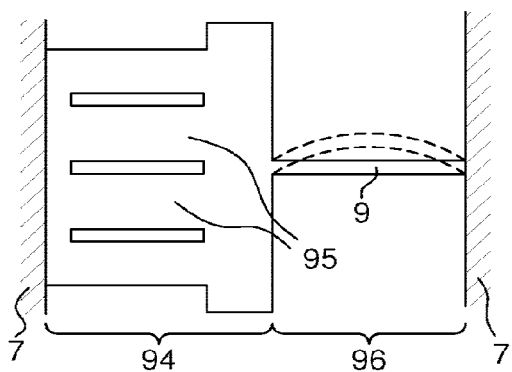
FIG. 7 illustrates another principle of prestressing using buckling resistance differential between a network of parallel beams made of oxidised silicon and a single prestressed buckled beam.

Another means of achieving buckling stresses in these strips is the by oxidising a silicon structure, of particular shape, set out in FIG. 7. Silicon oxidisation creates surface stresses which have the effect of increasing the length of an oxidised beam. FIG. 7 illustrates another prestressing principle using the buckling resistance differential between a network of parallel oxidised silicon beams and a single prestressed buckled beam, and shows a simple mechanism wherein, in the left part, a parallel structure 94 has a set of parallel beams 95 which, after oxidisation (in dotted lines), will force to buckle and bend, in the right part, a flexible element to be stressed 9, in this case a beam 9, 91, 92 or similar, which is required to be deformed, the buckling resistance of parallel structure 94 being much greater than that of the flexible element to be stressed 96. FIGS. 7A, 7B, 7C illustrate successive steps in a method of oxidising and buckling a beam P arranged between two apertures F1, F2 in a frame C. FIG. 7A shows the basic structure resulting from shaping by silicon etching, at the moment when it is placed in a furnace. FIG. 7B illustrates the development of silicon oxide $SiO_2$ inside apertures F1 and F2 and thus on the sides of beam P, by keeping the structure at 1100° C. for several hours; in a known manner, the growth of silicon dioxide $SiO_2$ occurs via the partial consumption of silicon towards the exterior of the component, and consequently in thin beam P, the proportion of silicon dioxide $SiO_2$ increases when the proportion of silicon decreases, over time during this treatment at 1100° C.

FIG. 7C shows the contraction of the structure after cooling to the ambient temperature, around 20° C. The lateral members M1, M2 of frame C, parallel to beam P, which are essentially formed of silicon and a little silicon dioxide, contract more than the beam P, which is then essentially formed of silicon dioxide which has a lower expansion coefficient than silicon. Consequently, beam P is subjected to a buckling stress and takes a bistable state.

Another variant is illustrated in FIG. 12.

Figure 17A:
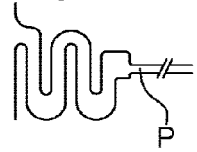
FIGS. 17A and 17B illustrate prestressing obtained by the encounter of oxide growths (before and after) in a coil.
Figure 17B:
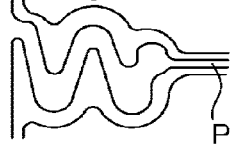

FIGS. 17A and 17B also illustrate the prestress obtained by the encounter of oxide growths in a coil.

Figure 18A:
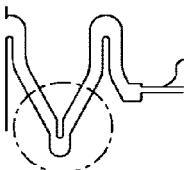
FIGS. 18A and 18B (and the details thereof in FIGS. 19A and 19B) show prestressing obtained by opening the angles at the apex of a zig-zag profile when silicon oxide is grown (before and after).
Figure 18B:
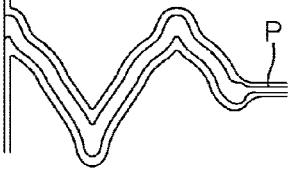
Figure 19A:
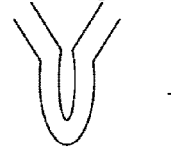
Figure 19B:
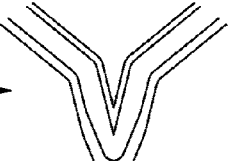
Figure 20A:
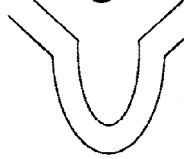
FIGS. 20A and 20B illustrate a variation in the angle obtained by varying (before and after) the radius of curvature of the oxidised walls in an area having a very low radius of curvature.
Figure 20B:

FIGS. 18A and 18*b* (and the details thereof in FIGS. 19A and 19B) show prestressing obtained by opening the angles at the apex of a zig-zag profile in accordance with the same principle: the growth of silicon oxide forces these angles to open, and the movement is amplified by the Z or zig-zag geometry of the structure. FIGS. 20A and 20B show the angle variation obtained by varying the radius of curvature of the oxidised walls in an area having a very low radius of curvature.

Thus, the invention also concerns a method whereby a flexible multistable or bistable strip is formed.

Figure 21:
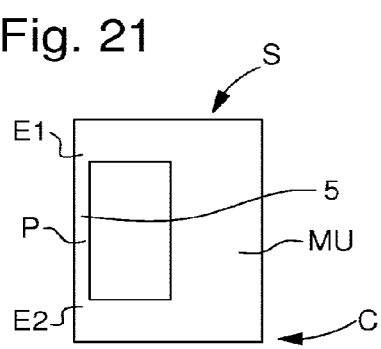
FIG. 21 is a schematic view of a flexible bistable strip cooperating with both ends of a single weight.
Figure 22:
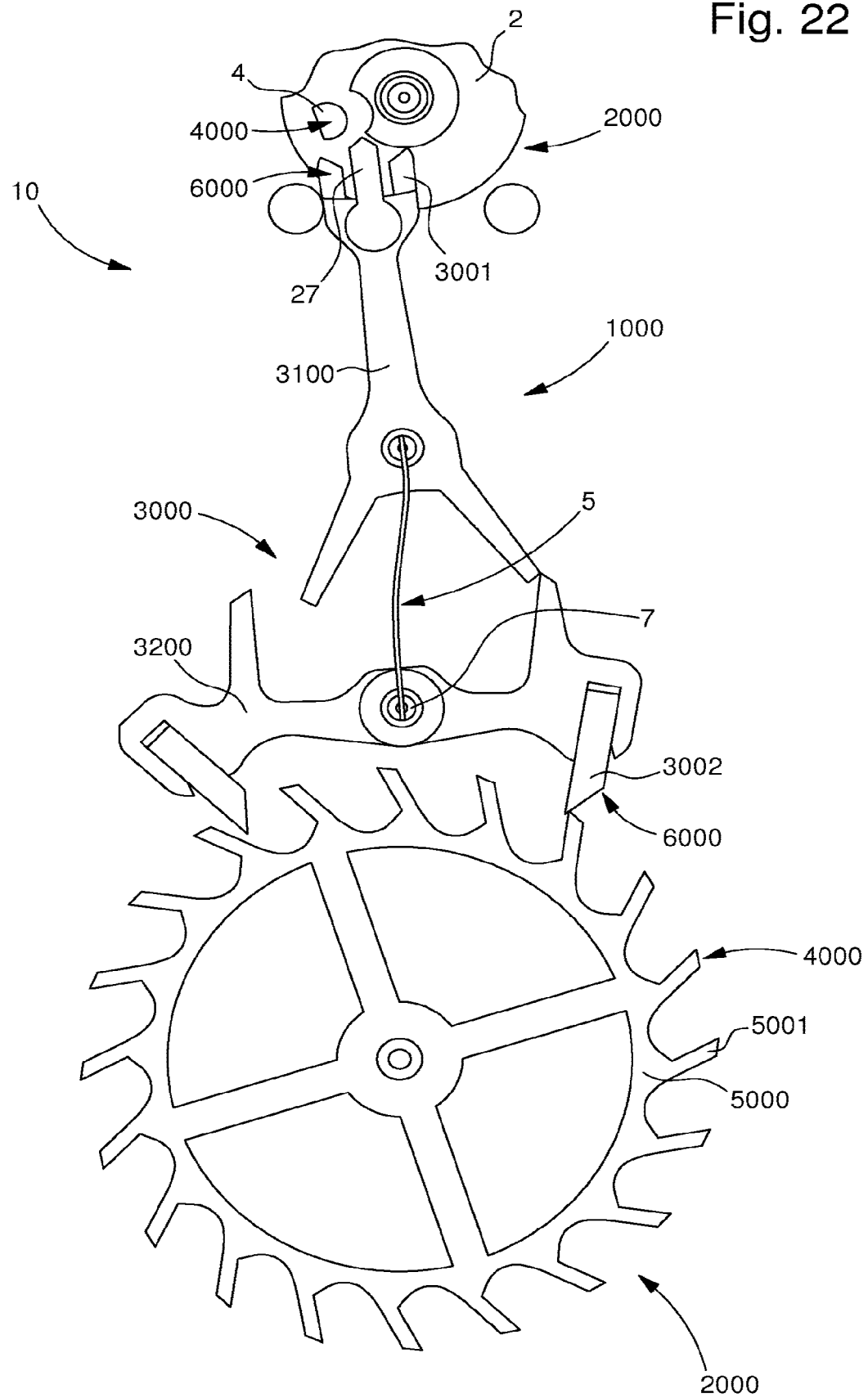
FIG. 22 illustrates a plan view of another application wherein the timepiece limiter or transmission mechanism is a pallet mechanism between a balance and an escape wheel.

In a first variant, illustrated in FIG. 21, a flexible multistable or bistable strip 5 cooperates with both ends E1, E2 of at least one weight, and in particular a single weight MU. The method then includes the following series of operations:

A silicon component S is etched in which a slender beam P of small section forms the connection between two ends E1, E2 having at least one mass MU of large cross-section (at least ten times greater than the small cross-section), said at least one mass MU forming a rigid frame C;

this component S is subjected, in a furnace, to a known silicon dioxide $SiO_2$ growth method by maintaining a temperature of 1100° C. for several hours;

this duration of several hours is adjusted so that a first ratio RA between the cross-section of beam P formed of silicon dioxide $SiO_2$ and the cross-section of beam P formed of silicon is more than 1; the silicon can then be completely oxidised in beam P which becomes flexible element 5. A second ratio RB between the cross-section of mass MU formed of silicon dioxide $SiO_2$ and the cross-section of mass MU formed of silicon is much lower than the first ratio RA. The RA/RB ratio is comprised between 2 and 10000 and preferably between 10 and 1000 and, in a preferred application, is more than 100.

cooling is performed to the ambient temperature, around 20° C. so as to cause beam P to buckle during the cooling of the at least one mass MU, whose contraction during cooling is greater than the contraction of beam P. FIGS. 7A, 7B, 7C illustrate a second variant implementation of a method of forming a flexible multistable or bistable strip, involving at least two masses. This method includes the following series of operations:

A silicon component S is etched in which a slender beam P of small cross-section forms the connection between at least two masses M1, M2 each of large cross-section (at least ten times greater than the small cross-section), said two masses M1, M2 forming together or with other structural elements a rigid frame C;

this component S is subjected, in a furnace, to a known silicon dioxide $SiO_2$ growth method by maintaining a temperature of 1100° C. for several hours;

this duration of several hours is adjusted so that the first ratio RA between the cross-section of beam P formed of silicon dioxide $SiO_2$ and the cross-section of beam P formed of silicon is more than 1; the silicon can then be completely oxidised in beam P which becomes flexible element 5. A second ratio RB between the cross-section of each of masses M1, M2 formed of silicon dioxide $SiO_2$ and the cross-section of the corresponding mass formed of silicon is much lower than the first ratio RA. The RA/RB ratio is comprised between 2 and 1000 and preferably between 10 and 1000 and, in a preferred application, is more than 100.

cooling is performed to the ambient temperature, around 20° C., so as to cause beam P to buckle during the cooling of the two masses M1 and M2, whose contraction during cooling is greater than the contraction of beam P.

In another variant embodiment, the structure of anti-trip mechanism 1 is made of single crystal quartz. As shown in FIG. 13, the top and bottom surfaces of the central single crystal quartz core are coated with a deposition made at a higher temperature than the ambient temperature, with a coefficient $\alpha$ lower than the coefficient $\alpha_{x,y}$ of quartz. This quartz coefficient $\alpha_{x,y}$ is 7.5 ppm/° C.

The anti-trip mechanism 1 illustrated here limits the direction of rotation of the balance in both directions of rotation. It only very slightly disturbs the oscillations of balance 2.

The invention may be used in watch mechanisms which do not have an anti-trip mechanism.

In another particular application, this timepiece limiter or transmission mechanism 1000 is a pallet lever mechanism 3000 for an escape mechanism, in particular, but not restrictively, a Swiss lever, with the same principle, for cooperation with a balance 2 and with an escape wheel 5000. This pallet lever 3000 includes at least one flexible multi-stable and notably multistable or bistable element 5. The lever may be made in a flexible lever embodiment having constant force in accordance with EP Patent Application No 12183559.9 of the same Applicant. The cooperation of this pallet lever 3000 with balance 2 is achieved by horns 3001 similar to the ends 63, 64 of arms 61 and 62 of the anti-trip stop member 6 described above. These horns 3001, carried by a first part 3100 of pallet lever 3000, are connected by at least one flexible multi-stable notably multistable or bistable strip 5, either to a fixed structure 7, or preferably to a second part 3200 of the pallet lever including pallet stones 3002 cooperating with the teeth 5001 of escape wheel 5000. Likewise, these pallet stones 3002 are advantageously formed in a similar manner to arms 61 and 62, and are connected by at least one flexible multi-stable notably multistable or bistable strip 5, either to a fixed structure 7, or preferably to first part 3100 of the pallet lever including horns 3001.

In a particularly advantageous manner, to improve rate and efficiency, the interaction between horns 3001 and balance 2 on the one hand, and/or pallet stones 3002 and escape wheel 5000 on the other hand, is achieved with no contact or with attenuated contact, and, for this purpose, the affected surfaces of horns 3001 and/or pallet stones 3002 are magnetised or electrified to cooperate in repulsion with opposing surfaces of the balance and/or respectively of the escape wheel, which are made of suitable material and/or are advantageously magnetised or respectively electrified in a complementary manner. Patent Application No PCT/EP2011/057578 in the name of the Swatch Group Research and Development Ltd discloses this type of contactless or attenuated contact transmission, the combination of which with a mechanism having a flexible multi-stable strip, particularly a pallet lever, provides the advantages required.

The invention further concerns a timepiece movement 10 including at least one regulating member having a balance 2, and which includes at least one timepiece limiter or transmission mechanism 1000 according to the invention. According to the case, movement 10 includes a structure 7 to which there is fixed a flexible multistable or bistable element 5 of said timepiece limiter or transmission mechanism 1000 or said flexible multistable or bistable element 5 actually forms this structure.

The invention also concerns a timepiece 100, in particular a watch, including at least one movement 10 of this type, or at least one timepiece limiter or transmission mechanism 1000 of this type.

Equivalent mechanisms based on conventional pivots and springs corresponding to the flexible multistable or bistable pivots are considered to form part of the present invention.

The technologies used to make the device are not limited to silicon technology but also include "LIGA", MEMS and other micro-manufacturing methods.

The invention claimed is:

1. A timepiece limiter or transmission mechanism to limit or transmit an angular travel of a mobile component of a timepiece movement, said mobile component including at least one projecting pin or tooth, said timepiece limiter or transmission mechanism comprising:

a limiting or transmission component which is fixed, via at least one monolithic flexible multistable bistable element, to another component of said movement or to a rigid structural element of said movement, wherein said mechanism forms an anti-trip mechanism to limit the angular travel of a timepiece balance of a timepiece movement, said balance including a staff and a pin projecting from said staff, said anti-trip mechanism including at least one flexible multistable or bistable element, carrying at least one anti-trip stop member, and which is fixed, via a plurality of flexible and elastic connecting members, to a rigid structural element of said timepiece movement, and wherein one end of said anti-trip stop member is arranged, according to an angular position of said balance, to interfere with a trajectory of said pin, and to perform a function of a stop member if said balance exceeds a normal angular travel thereof, wherein said anti-strip stop member includes two arms, whose respective ends can each interfere with the trajectory of said pin, wherein said flexible multistable or bistable element is fixed, via at least two flexible strips forming said flexible and elastic connecting elements, to said rigid structural element and wherein said anti-trip stop member includes at least two levels in order to hold said arms in a plane of said pin, on a first top level with said arms cooperating with said pin, and on a second lower level with a dart cooperating with a notch in said balance, and wherein said flexible multistable or bistable element includes flexible elements integrated in said arms of said stop member to prevent excessive shocks, wherein said flexible multistable or bistable element and said at least one anti-trip stop member together form a monolithic component, wherein said flexible and elastic connecting members are formed by at least thin strips each fixed at a first end to the structural element and connected via a second end to the body of the flexible element in a "V" shape, so as to define a virtual pivot about which the anti-trip stop member pivots, said flexible multistable or bistable element forming a flexible multistable or bistable pivot, and wherein two additional flexible strips are mounted prestressed and buckled relative to said structural element or relative to a frame comprised in said flexible multistable or bistable element, and said two additional flexible strips are each fixed at a first end to the structural element and connected via a second end to the body of the flexible element.

2. The timepiece limiter or transmission mechanism according to claim 1, wherein the structural element thereof is made with a central single crystal quartz core, the top and bottom surfaces of which are coated with a deposition having a coefficient $\alpha$ lower than the coefficient $\alpha_{x,y}$ of quartz which is 7.5 ppm/°C.

3. The timepiece limiter or transmission mechanism according to claim 1, wherein said flexible multistable or bistable element includes at least one prestressed beam buckled in a second mode where said beam adopts an S or Z shape, a pivot forcing said beam to have a nodal point at the middle thereof.

4. The timepiece limiter or transmission mechanism according to claim 3, wherein said flexible multistable or bistable pivot is made by buckling two prestressed beams, and in that a third beam fixed to said structure or to a frame of said flexible multistable or bistable structure, forces said beam formed of said two beams to deform in said second mode, and in that said third beam forms said pivot.

5. The timepiece limiter or transmission mechanism according to claim 4, wherein said flexible multistable or bistable element is made of silicon, and in that pockets of silicon oxide SiO2 are created in a frame of said flexible multistable or bistable element and ensure the prestressing of said two beams.

6. The timepiece limiter or transmission mechanism according to claim 1, wherein said flexible multisable or bistable element includes at least one prestressed first beam buckled in a second mode wherein said first beam adopts an S or Z shape, and in that said flexible multistable or bistable element is made of silicon, and has a parallel structure including a set of parallel second beams which are oxidised and ensure the bending and buckling of said first beam to be stressed, the buckling resistance of said parallel structure being much greater than that of said first beam to be stressed.

7. The timepiece limiter or transmission mechanism according to claim 1, wherein the mechanism includes a protective shock absorber mechanism for said flexible multistable or bistable element including shock absorber stop members, which cooperate in abutment with arms of at least one said anti-trip stop member and not to transmit these shocks to flexible arms to avoid breaking said flexible arms.

8. The timepiece limiter or transmission mechanism according to claim 7, wherein a shock absorber stop member is coaxial with the flexible multistable or bistable pivot.

9. The timepiece limiter or transmission mechanism according to claim 7, herein the shock absorber stop members include substantially cylindrical protuberances, which cooperate with grooves of substantially complementary shape in said arms.

10. The timepiece limiter or transmission mechanism according to claim 1, wherein the mechanism includes a protective shock absorber mechanism for said flexible multistable or bistable element including a shock absorber stop member located in the centre of rotation of said flexible multistable or bistable pivot.

11. The timepiece limiter or transmission mechanism according to claim 1, wherein said flexible multistable or bistable element is made in a single piece with said structural element.

12. A timepiece mechanism including at least one regulating member having a balance, and which includes at least one timepiece limiter or transmission mechanism according to claim 1, and wherein said movement includes a structure to which one said flexible multistable or bistable element of said timepiece limiter or transmission mechanism is fixed, or which is formed by said flexible multistable or bistable element.

13. A timepiece including at least one timepiece limiter or transmission mechanism according to claim 1.

14. A timepiece limiter or transmission mechanism to limit or transmit an angular travel of a mobile component of a timepiece movement, said mobile component including at least one projecting pin or tooth, said timepiece limiter or transmission mechanism comprising:
a limiting or transmission component which is fixed, via at least one monolithic flexible multistable or bistable element, to another component of said movement or to a rigid structural element of said movement,
wherein said mechanism forms an anti-trip mechanism to limit the angular travel of a timepiece balance of a timepiece movement, said balance including a staff and a pin projecting from said staff said anti-trip mechanism including at least one flexible multistable or bistable element, carrying at least one anti-trip stop member, and which is fixed, via a plurality of flexible and elastic connecting members, to a rigid structural element of said timepiece movement, and
wherein one end of said anti-trip stop member is arranged. according to an angular position of said balance, to interfere with a trajectory of said pin, and to perform a function of a stop member if said balance exceeds a normal angular travel thereof, wherein said anti-strip stop member includes two arms, whose respective ends can each interfere with the trajectory of said pin, wherein said flexible multistable or bistable element is fixed, via at least two flexible strips forming said flexible and elastic connecting elements, to said rigid structural element and wherein said anti-trip stop member includes at least two levels in order to hold said arms in a plane of said pin, on a first op level with said arms cooperating with said pin, and on a second lower level with a dart cooperating with a notch in said balance, and wherein said flexible multistable or bistable element includes flexible elements integrated in said arms of said stop member to prevent excessive shocks, wherein said flexible multistable or bistable element and said at least one anti-trip stop member together form a monolithic component, wherein said flexible and elastic connecting member are formed by at least two thin strips each fixed at a first end to the structural element and connected via a second end to the body of the flexible element in a "V" shape. so as to define a virtual pivot about which the anti-trip stop member pivots, said flexible multistable or bistable element forming a flexible multistable or bistable pivot, wherein the structural element contains a system of self-alignment with the staff of balance.

15. A timepiece limiter or transmission mechanism to limit or transmit an angular travel of a mobile component of a timepiece movement, said mobile component including at least one projecting pin or tooth, said timepiece limiter or transmission mechanism comprising:
a limiting or transmission component which is fixed, via a least one monolithic flexible multistable or bistable element, to another component of said movement or to a rigid structural element of said movement,
wherein said mechanism forms an anti-trip mechanism to limit the angular travel of a timepiece balance of a timepiece movement, said balance including a staff and a pin projecting from said staff, said anti-trip mechanism including at least one flexible multistable or bistable element, carrying at least one anti-trip stop member, and which is fixed, via a plurality of flexible and elastic connecting members, to a rigid structural element of said timepiece movement, and wherein one end of said anti-trip stop member is arranged, according to an angular position of said balance, to interfere with a trajectory of said pin, and to perform a function of a stop member if said balance exceeds a normal angular travel thereof, wherein said anti-strip stop member includes two arms, whose respective ends can each interfere with the trajectory of said pin, wherein said flexible multistable or bistable element is fixed, via at least two flexible strips forming said flexible and elastic connecting elements, wherein said flexible and elastic connecting members are formed by at least two thin strips each fixed at a first end to the structural element and connected via a second end to the body of the flexible element in a "V" shape, so as to define a virtual pivot about which the anti-trip stop member pivots, said flexible multistable or bistable element forming a flexible multistable or bistable pivot, and wherein two additional flexible strips are mounted prestressed and buckled relative to said structural element or relative to a frame comprised in said flexible multistable or bistable element, and said two additional flexible strips are each fixed at a first end to the structural element and connected via a second end to the body of the flexible element.

\* \* \* \* \*